United States Patent
Kim et al.

(10) Patent No.: US 7,663,166 B2
(45) Date of Patent: Feb. 16, 2010

(54) WIRE-TYPE SEMICONDUCTOR DEVICES AND METHODS OF FABRICATING THE SAME

(75) Inventors: Suk-Pil Kim, Yongin-si (KR); Yoon-Dong Park, Yongin-si (KR); Won-Joo Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 96 days.

(21) Appl. No.: 11/723,074

(22) Filed: Mar. 16, 2007

(65) Prior Publication Data

US 2008/0017934 A1 Jan. 24, 2008

(30) Foreign Application Priority Data

May 18, 2006 (KR) .................... 10-2006-0044635

(51) Int. Cl.
*H01L 27/088* (2006.01)
(52) U.S. Cl. .................. 257/288; 257/401; 257/317; 257/321; 257/E29.128; 438/284; 438/335
(58) Field of Classification Search .............. None
See application file for complete search history.

(56) References Cited

U.S. PATENT DOCUMENTS

| 6,664,582 | B2 | 12/2003 | Fried et al. | |
|---|---|---|---|---|
| 7,456,476 | B2* | 11/2008 | Hareland et al. | 257/349 |
| 2005/0167650 | A1* | 8/2005 | Orlowski et al. | 257/16 |
| 2005/0266645 | A1* | 12/2005 | Park | 438/282 |
| 2007/0029586 | A1* | 2/2007 | Orlowski | 257/287 |

* cited by examiner

*Primary Examiner*—Minh-Loan T Tran
*Assistant Examiner*—Fei Fei Yeung Lopez
(74) *Attorney, Agent, or Firm*—Harness, Dickey & Pierce, PLC

(57) ABSTRACT

Provided are relatively higher-performance wire-type semiconductor devices and relatively economical methods of fabricating the same. A wire-type semiconductor device may include at least one pair of support pillars protruding above a semiconductor substrate, at least one fin protruding above the semiconductor substrate and having ends connected to the at least one pair of support pillars, at least one semiconductor wire having ends connected to the at least one pair of support pillars and being separated from the at least one fin, a common gate electrode surrounding the surface of the at least one semiconductor wire, and a gate insulating layer between the at least one semiconductor wire and the common gate electrode.

7 Claims, 12 Drawing Sheets

WIRE-TYPE SEMICONDUCTOR DEVICES AND METHODS OF FABRICATING THE SAME

PRIORITY STATEMENT

This application claims priority under 35 U.S.C. § 119 to Korean Patent Application No. 10-2006-0044635, filed on May 18, 2006, in the Korean Intellectual Property Office (KIPO), the entire disclosure of which is incorporated herein by reference.

BACKGROUND

1. Field

Example embodiments relate to semiconductor devices and methods of fabricating the same. For example, example embodiments may relate to a wire-type semiconductor device and a method of fabricating the same.

2. The Related Art

In the related art, as the integration density of semiconductor devices increases, a more restricted design rule may be applied to elements of the semiconductor devices. For example, in a semiconductor device requiring a large number of transistors, the gate length, which may be a standard design rule applied in the fabrication of a semiconductor device, may be short, and thus the channel length may be reduced. Such a reduction in the channel length of a transistor may cause short channel effects.

Short channel effects may make it difficult to control transistors, and thus an off-current of the transistors may increase. As a result, the reliability of the transistors, for example, refresh characteristics of a memory device using the transistors, may deteriorate. Transistors having a thin body structure have been researched in order to suppress short channel effects, which are problematic in conventional planar transistors, while simultaneously increasing operation current.

For example, U.S. Pat. No. 6,664,582 by David M. Fried et al. discloses a Fin-FET and a fin memory cell. However, because the Fin-FET is manufactured using a silicon-on-insulator (SOI) substrate, the manufacturing cost is high, and the entire fin may not be used as a channel region. Therefore, there may be a limit to increasing the operation current, i.e., the speed of a memory cell using the Fin-FET. For this reason, research on transistor structures having, for example, wire-type channels in which the entire fin can be utilized as a channel region, is being performed.

SUMMARY

Example embodiments may provide relatively high-performance semiconductor devices with suppressed short channel effects.

Example embodiments may further provide an economical method of fabricating the semiconductor devices.

According to example embodiments, a wire-type semiconductor device may include at least one pair of support pillars protruding above a semiconductor substrate, at least one fin protruding above the semiconductor substrate and having ends connected to the at least one pair of support pillars, at least one semiconductor wire having ends connected to the at least one pair of support pillars and being separated from the at least one fin, a common gate electrode surrounding the surface of the at least one semiconductor wire, and a gate insulating layer between the at least one semiconductor wire and the common gate electrode.

In an example embodiment, the at least one semiconductor wire may be formed by etching the semiconductor substrate.

In an example embodiment, the semiconductor substrate may include one of a bulk silicon wafer, a bulk germanium wafer, and a bulk silicon-germanium wafer.

In an example embodiment, a plurality of semiconductor wires may be formed above the at least one fin.

In an example embodiment, a plurality of fins may be formed on the semiconductor substrate, and the at least one semiconductor wire may be formed above the plurality of fins.

In an example embodiment, each of the support pillars may include a recess portion.

In an example embodiment, the pair of support pillars may be doped with first conductive type impurities, a portion of the at least one semiconductor wire surrounded by the common gate electrode may be doped with second conductive type impurities, and the second conductive type impurities have a conductivity opposite to the conductivity of the first conductive type impurities.

In an example embodiment, end portions of the at least one semiconductor wire are exposed by the common gate electrode and are doped with the first conductivity type impurities.

In an example embodiment, the common gate electrode covers an upper portion of the fin on the semiconductor substrate, and a gate insulating layer may be formed between the common gate electrode and the at least one fin.

In an example embodiment, the wire-type semiconductor device may further include a device insulating layer on the body, the device insulating layer exposing the upper portion of the at least one fin on the semiconductor substrate.

According to example embodiments, a method of fabricating a wire-type semiconductor device may include forming at least one pair of support pillars protruding above a semiconductor substrate, forming at least one fin protruding above the semiconductor substrate having ends connected to the at least one pair of support pillars, forming at least one semiconductor wire having ends connected to the at least one pair of support pillars separate from the at least one fin, forming a gate insulating layer on the at least one semiconductor wire, and forming a common gate electrode on the gate insulating layer to surround the at least one semiconductor wire.

In an example embodiment, the forming at least one pair of support pillars may include selectively etching the semiconductor substrate.

In an example embodiment, the forming at least one fin may include selectively etching the semiconductor substrate.

In an example embodiment, the forming at least one semiconductor wire may include forming a device insulating layer on the semiconductor substrate exposing an upper portion of the at least one fin, forming a spacer insulating layer on exposed sidewalls of the at least one fin, exposing a portion of the at least one fin by etching the device insulating layer using the spacer insulating layer as an etch mask, and forming a tunnel layer by partially removing the exposed portion of the at least one fin, thereby forming the at least one semiconductor wire.

In an example embodiment, the device insulating layer is etched by a predetermined thickness.

In an example embodiment, the device insulating layer may include an oxide layer, and the spacer insulating layer may include a nitride layer or an oxynitride layer.

In an example embodiment, the forming the tunnel layer may include thermally oxidizing a portion of the at least one fin, and removing the thermally oxidized portion of the at least one fin.

In an example embodiment, the removing may include wet etching.

In an example embodiment, the device insulating layer may be formed to further expose upper portions of the support pillars, and the spacer insulating layer may be further formed on sidewalls of the support pillars, and the method may further include forming a recess portion by etching the exposed upper portions of the support pillars simultaneously with the partially removing of the exposed portion of the at least one fin.

In an example embodiment, the method may further include forming a plurality of semiconductor wires above the at least one fin, wherein each of the semiconductor wires is separated from the at least one fin, and both ends of each of the semiconductor wires are connected to the at least one pair of support pillars.

In an example embodiment, the forming the plurality of semiconductor wires may include forming a device insulating layer on the semiconductor substrate exposing an upper portion of the at least one fin, forming a spacer insulating layer on exposed sidewalls of the at least one fin, exposing a portion of the at least one fin by etching the device insulating layer using the spacer insulating layer as an etch mask, and forming a tunnel layer by partially removing the exposed portion of the at least one fin, thereby forming one semiconductor wire of the plurality of semiconductor wires.

In an example embodiment, the method may further include sphericalizing the at least one semiconductor wire.

In an example embodiment, the sphericalizing may include thermally oxidizing a surface of the at least one semiconductor wire.

In an example embodiment, the gate insulating layer may be further formed on an upper portion of the at least one fin, and the common gate electrode further covers the upper portion of the at least one fin.

In an example embodiment, the semiconductor substrate may include one of a bulk silicon wafer, a bulk germanium wafer, and a bulk silicon-germanium wafer.

According to an example embodiment, a wire-type semiconductor device may include a semiconductor substrate, at least one semiconductor wire, a common gate electrode, and a gate insulating layer. The semiconductor substrate may include a body, a pair of support pillars protruding above the body, and at least one fin that protrudes above the body and has ends that are connected to the pair of support pillars. The at least one semiconductor may be formed so as to be separated from the at least one fin and has ends that are connected to the pair of support pillars. The common gate electrode may be formed so as to surround the surface of the at least one semiconductor wire. The gate insulating layer may be interposed between the at least one semiconductor wire and the common gate electrode.

The at least one semiconductor wire may be formed by etching the semiconductor substrate. A plurality of semiconductor wires may be formed above the at least one fin on the semiconductor substrate.

Each of the support pillars may include a recess portion.

The common gate electrode may cover an upper portion of the fin on the semiconductor substrate, and a gate insulating layer may be further formed between the common gate electrode and the at least one fin on the semiconductor substrate.

According to another example embodiment, a method of fabricating a wire-type semiconductor device may include the following processes. A semiconductor substrate may be selectively etched so as to form a pair of support pillars protruding above a body of the semiconductor substrate, and at least one fin that protrudes above the body and has ends that are connected to the pair of support pillars. A device insulating layer may be formed on the body of the semiconductor substrate so as to expose an upper portion of the at least one fin. A spacer insulating layer is formed on sidewalls of the at least one fin, which are exposed by the device insulating layer. A portion of the at least one fin may be exposed by etching the device insulating layer by a predetermined thickness using the spacer insulating layer as an etch mask. A tunnel may be formed by partially removing the exposed portion of the at least one fin, thereby resulting in at least one semiconductor wire that is separated from the at least one fin and has ends that are connected to the pair of support pillars. A gate insulating layer may be formed on the at least one semiconductor wire. A common gate electrode may be formed on the gate insulating layer so as to surround the at least one semiconductor wire.

A plurality of semiconductor wires may be respectively formed above the at least one fin by repeating the forming of the spacer insulating layer, the exposing of the portion of the at least one fin, and the forming the tunnel by removing the exposed portion of the at least one fin, wherein each of the semiconductor wires is separated from the at least one fin, and both ends of each of the semiconductor wires are connected to the pair of support pillars.

The method may further include sphericalizing the at least one semiconductor wire.

BRIEF DESCRIPTION OF THE DRAWINGS

Example embodiments will become more apparent by describing the example embodiments in detail with reference to the attached drawings in which.

DETAILED DESCRIPTION OF EXAMPLE EMBODIMENTS

Figure 1:
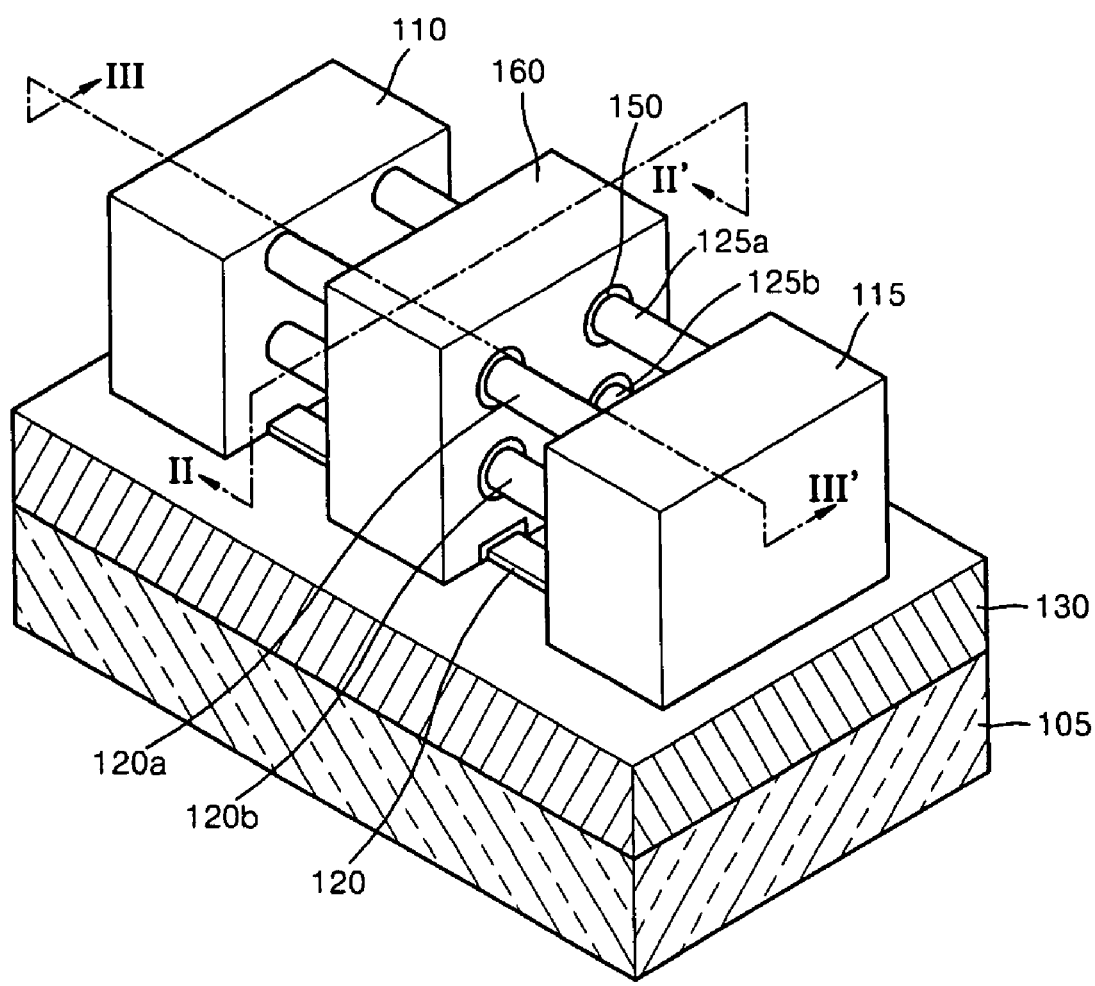
FIG. 1 is a perspective view of a wire-type semiconductor device, according to an example embodiment.

Example embodiments will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the example embodiments to those skilled in the art. In the drawings, the sizes of elements are exaggerated for clarity.

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Throughout the example embodiments described below, a wire-type semiconductor device may refer to a semiconductor device having a wire-structured channel. In most wire-type semiconductor devices, semiconductor wires forming channels have a size in the nano-scale. Accordingly, the term "nano-wire semiconductor device" may also be used. Further, in at least one example embodiment structures of wire-type semiconductor devices may form a part or portion of a memory device.

A wire-type semiconductor device according to an example embodiment may include at least one fin and at least one semiconductor wire. The numbers of fins and the number of semiconductor wires are not limited. The fins and the semiconductor wires in the drawings are for illustrative purpose only.

Figure 2:
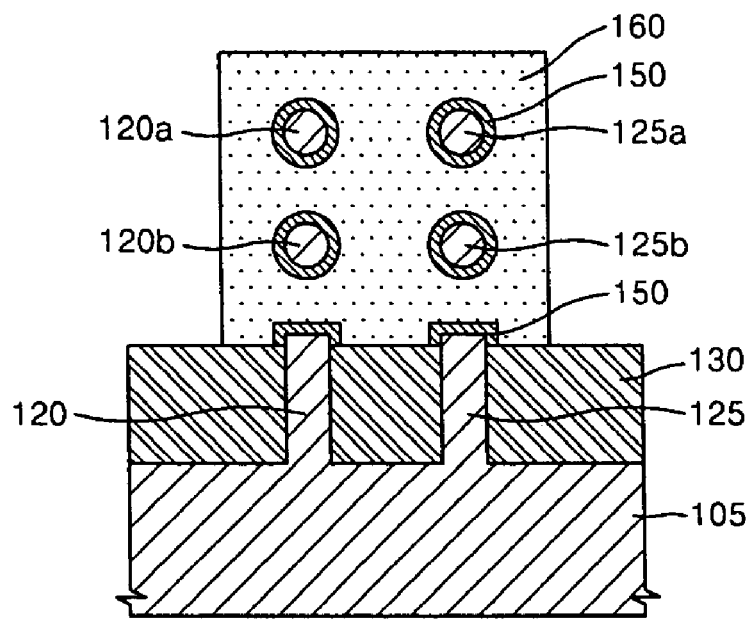
FIG. 2 is a sectional view of the wire-type semiconductor device of FIG. 1 taken along line II-II'.
Figure 3:
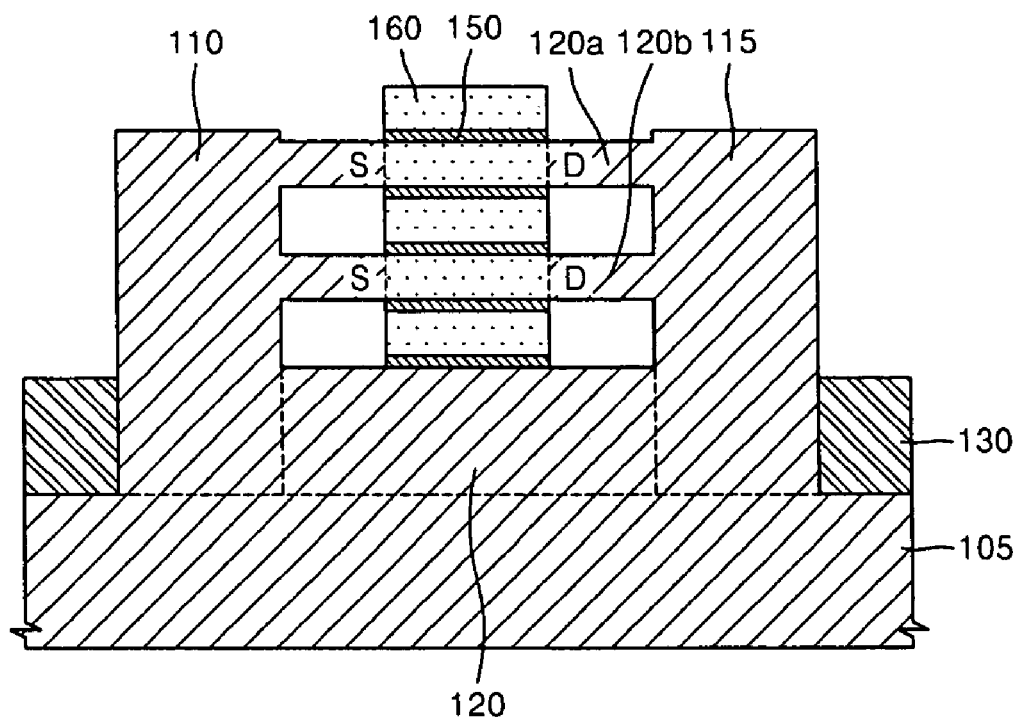
FIG. 3 is a sectional view of the wire-type semiconductor device of FIG. 1 taken alone line III-III'.

FIG. 1 is a perspective view of a wire-type semiconductor device according to an example embodiment. FIG. 2 is a sectional view of the wire-type semiconductor device taken along line II-II' in FIG. 1. FIG. 3 is a sectional view of the wire-type semiconductor device taken along line III-III' in FIG. 1.

Referring to FIG. 1 through 3, the wire-type semiconductor device may include a semiconductor substrate, four semiconductor wires 120a, 120b, 125a, and 125b, gate insulating layers 150, and a common gate electrode 160. The semiconductor wires 120a, 120b, 125a, and 125b may be used as channels. The common gate electrode 160 may control the semiconductor wires 120a, 120b, 125a, and 125b simultaneously. The gate insulating layers 150 may insulate the common gate electrode 160 and the respective semiconductor wires 120a, 120b, 125a, and 125b. Each of the elements will be described in detail below.

The semiconductor substrate may include a body 105, a pair of support pillars 110 and 115, and a pair of fins 120 and 125. The semiconductor substrate may be a bulk wafer. For example, the body 105, the support pillars 110 and 115, and the fins 120 and 125 may be formed of the same material. For example, the semiconductor substrate may be a bulk silicon wafer, a bulk germanium wafer, or a bulk silicon-germanium wafer, although example embodiments should not be limited to only these examples.

The body 105 may occupy most of the semiconductor substrate. The shape of the body 105 is not specifically limited. For example, the body 105 may be a portion of the semiconductor substrate excluding the support pillar 110 and 115 and the fins 120 and 125. The support pillars 110 and 115 may protrude upward and may be arranged to face each other. The fins 120 and 125 may be separated from each other, and both ends of each of the fins 120 and 125 may be respectively connected to the support pillars 110 and 115.

The semiconductor wires 120a, 120b, 125a, and 125b may be separated from the fins 120 and 125. Both ends of each of the semiconductor wires 120a, 120b, 125a, and 125b may be connected to, and supported by, the support pillars 110 and 115. For example, the semiconductor wires 120a, 120b, 125a, and 125b may be formed by etching the semiconductor substrate. Accordingly, the body 105, the support pillars 110 and 115, and the fins 120 and 125 may be formed of the same material. For example, when the semiconductor substrate is a bulk semiconductor wafer, the semiconductor wires 120a, 120b, 125a, and 125b may be formed by etching the bulk semiconductor wafer, instead of being formed as separate semiconductor epitaxial layers.

The semiconductor wires 120a, 120b, 125a, and 125b may have cylindrical shapes, i.e., circular cross-sections. However, the shapes of the semiconductor wires 120a, 120b, 125a, and 125b are not specifically limited. For example, the semiconductor wires 120a, 120b, 125a, and 125b may have rectangular pillar shapes, elliptic pillar shapes, and/or triangular pillar shapes, any combination thereof, or any other suitable shape. The semiconductor wires 120a, 120b, 125a, and 125b may be arranged in the same rows as the fins 120 and 125. For example, the number of semiconductor wires arranged above the first fin 120 may be the same as the number of semiconductor wires arranged above the second fin 125. For example, a first pair of semiconductor wires 120a and 120b are arranged in the same row as the first fin 120, and a second pair of semiconductor wires 125a and 125b are arranged in the same raw as the second fin 125.

The common gate electrode 160 may be formed so as to surround the semiconductor wires 120a, 120b, 125a, and 125b. In other words, the common gate electrode 160 may simultaneously control the semiconductor wires 120a, 120b, 125a, and 125b. When a turn-on voltage is applied to the common gate electrode 160, channels may be simultaneously formed in the semiconductor wires 120a, 120b, 125a, and 125b. In this example, because the common gate electrode 160 completely surrounds each of the semiconductor wires 120a, 120b, 125a, and 125b, a channel can be uniformly formed on the surface of, and/or inside each of the semiconductor wires 120a, 120b, 125a, and 125b.

Alternatively, the common gate electrode 160 may be formed so as to further cover upper portions of the first and second fins 120 and 125. In this example, upper regions of each of the first and second fins 120 and 125 may be used as channels. The common gate electrode 160 may include a polysilicon layer, a metal layer, a metal silicide layer, or a composite layer thereof.

The device insulating layer 130 may be formed on the body 105 so as to expose at least a part of the support pillars 110 and 115. For example, the device insulating layer 130 may include an oxide layer and/or a nitride layer. When upper portions of the first and second fins 120 and 125 are used as channels, the upper portions of the first and second fins 120 and 125 may be formed so as to be exposed by the device insulating layer 130. The common gate electrode 160 may be insulated from the body 105 of the semiconductor substrate by the device insulating layer 130.

The gate insulating layer 150 may be interposed between the common gate electrode 160 and each of the semiconductor wires 120*a*, 120*b*, 125*a*, and 125*b*. The gate insulating layer 150 may be further interposed between the top surface of each of the first and second fins 120 and 125 and the common gate electrode 160. The gate insulating layer 150 may insulate the semiconductor substrate from the common gate electrode 160 and may have a specific thickness at which the channels formed in the semiconductor wires 120*a*, 120*b*, 125*a*, and 125*b* and/or the first and second fins 120 and 125 may be appropriately controlled. For example, the gate insulating layer 150 may include an oxide layer and/or a high-dielectric constant layer. For example, a high-dielectric constant layer may be a layer including material having a high or relatively high dielectric constant. Such materials may include, for example, high-k or high-kappa materials such as $SiN_x$, $Ta_2O_5$, $Al_2O_3$, and/or $TiO_2$. Although example embodiments should not be limited to only these examples.

End portions of each of the semiconductor wires 120*a*, 120*b*, 125*a*, and 125*b* on both sides of the common gate electrode 160 may be doped with first conductive type impurities so as to be used as a source region S and a drain region D. The source region S and the drain region D may extend to the support pillars 110 and 115. In other words, the support pillar 110 and 115 may be doped with the same first conductive type impurities as used in the source region S and the drain region D. Channel portions of the semiconductor wires 120*a*, 120*b*, 125*a*, and 125*b* may be doped with second conductive type impurities. For example, the first conductive type impurities may be n-type impurities, and the second conductive type impurities may be p-type impurities. Alternatively, the first conductive type impurities may be p-type impurities, and the second conductive type impurities may be n-type impurities.

In the wire-type semiconductor device according to example embodiments, the plurality of semiconductor wires 120*a*, 120*b*, 125*a*, and 125*b* may be connected in parallel to the support pillars 110 and 115, and thus, a relatively high operating current may be supplied. Accordingly, the wire-type semiconductor device may achieve a relatively higher performance. In addition, the semiconductor wires 120*a*, 120*b*, 125*a*, and 125*b* may be controlled by the common gate electrode 160 with better efficiency. For example, a desired operating current level may be obtained by varying the number of semiconductor wires 120*a*, 120*b*, 125*a*, and 125*b*.

In addition, the wire-type semiconductor device according to example embodiments may suppress short channel effects by using the semiconductor wires 120*a*, 120*b*, 125*a*, and 125*b* having a small sectional area. Short channel effects may be suppressed in thin body structures.

Figure 4:
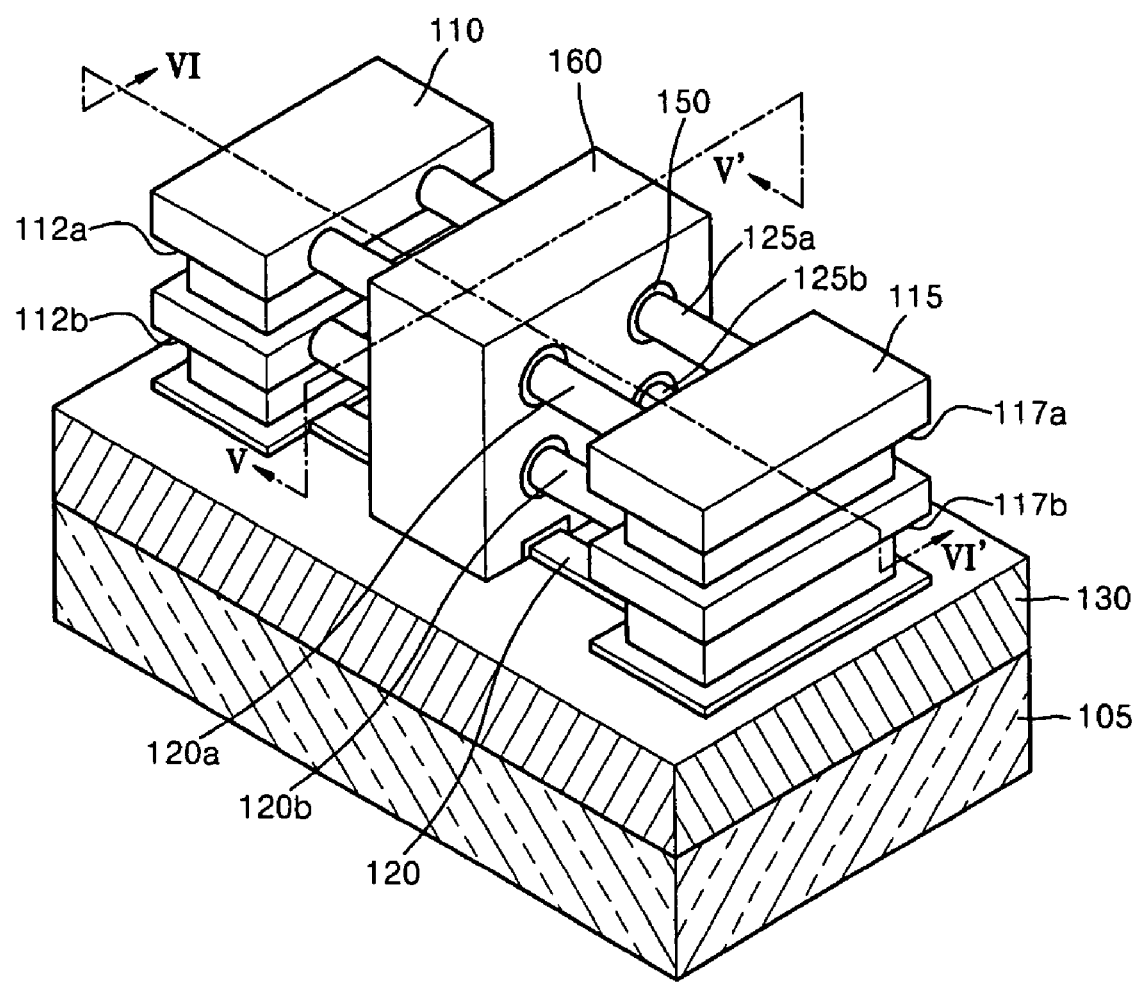
FIG. 4 is a perspective view of a wire-type semiconductor device, according to an example embodiment.
Figure 5:
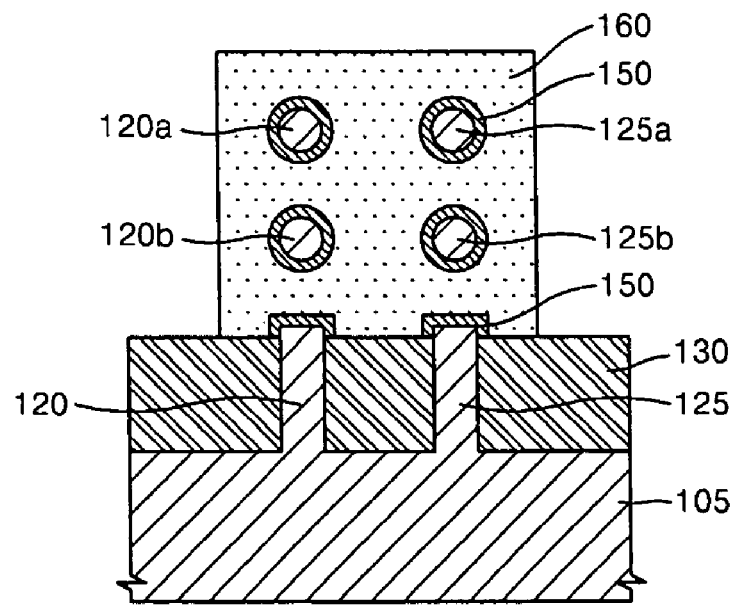
FIG. 5 is a sectional view of the wire-type semiconductor device of FIG. 4 taken along line V-V'.
Figure 6:
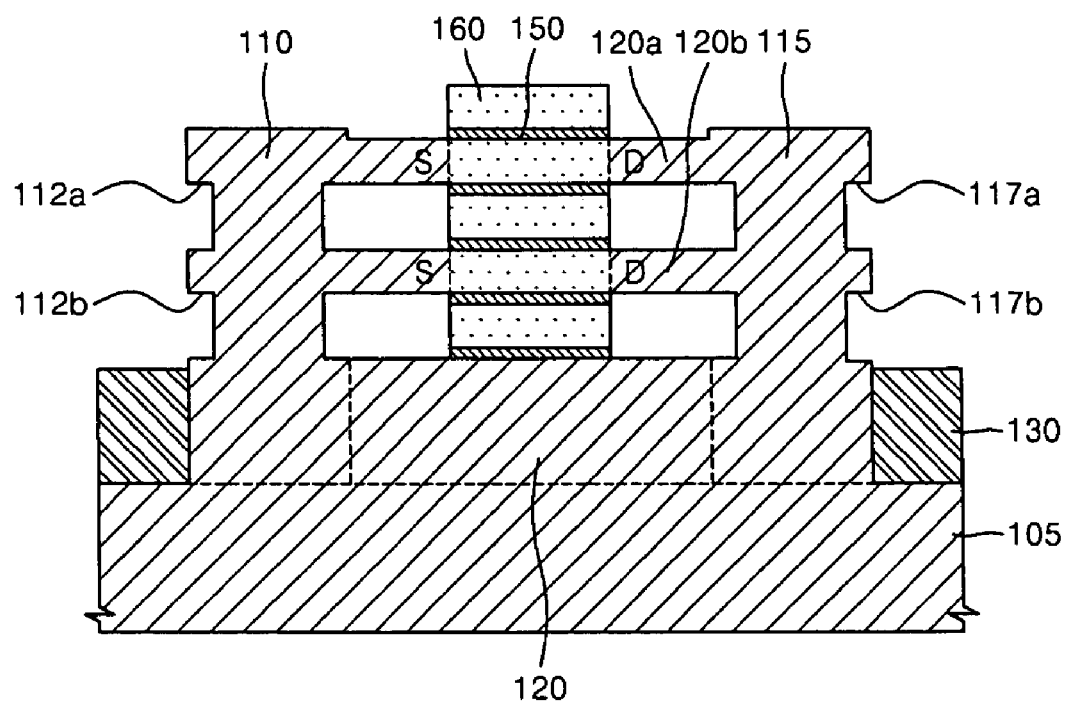
FIG. 6 is a sectional view of the wire-type semiconductor device of FIG. 4 taken along line VI-VI'.

Hereinafter, a wire-type semiconductor device according to an example embodiment will be described in detail. FIG. 4 is a perspective view of a wire-type semiconductor device according to an example embodiment. FIG. 5 is a sectional view of the wire-type semiconductor device of FIG. 4 taken along line V-V'. FIG. 6 is a sectional view of the wire-type semiconductor device of FIG. 4 taken along line VI-VI'. The wire-type semiconductor device in FIG. 4 through 6 is modified from the wire-type semiconductor device in FIGS. 1 through 3. In the two example embodiments illustrated in FIG. 1 and 3, like reference numerals refer to like elements, and thus their descriptions will not be repeated.

Referring to FIG. 4 through 6, a wire-type semiconductor device according to another embodiment may include a semiconductor substrate, semiconductor wires 120*a*, 120*b*, 125*a*, and 125*b*, gate insulating layers 150, and a common gate electrode 160. Unlike the wire-type semiconductor device in FIG. 1 through 3, the first and second support pillars 110 and 115 on the semiconductor substrate respectively include a pair of recess portions 112*a* and 112*b* and a pair of recess portions 117*a*, and 117*b*.

The recess portions 112*a* and 112*b* may be portions of the first support pillar 110, which have a relatively smaller width than the first support pillar 110. The recess portions 112*a* and 112*b* are formed along a side of the first support pillar 110 and may have different heights. The recess portions 117*a* and 117*b* may be portions of the second support pillar 115 which have a smaller width than the second support pillar 115. The recess portions 117*a* and 117*b* are formed along a side of the second support pillar 115 and may have different heights. The upper recess portions 112*a* and 117*a* may be formed between the upper semiconductor wires 120*a* and 125*a* and the lower semiconductor wires 120*b* and 125*b*. The lower recess portions 112*b* and 117*b* may be formed between the lower semiconductor wires 120*b* and 125*b* and the fins 120 and 125.

Hereinafter, a method of fabricating a wire-type semiconductor device according to an embodiment of the present invention will be described with reference to FIG. 7 through 14.

Figure 7:
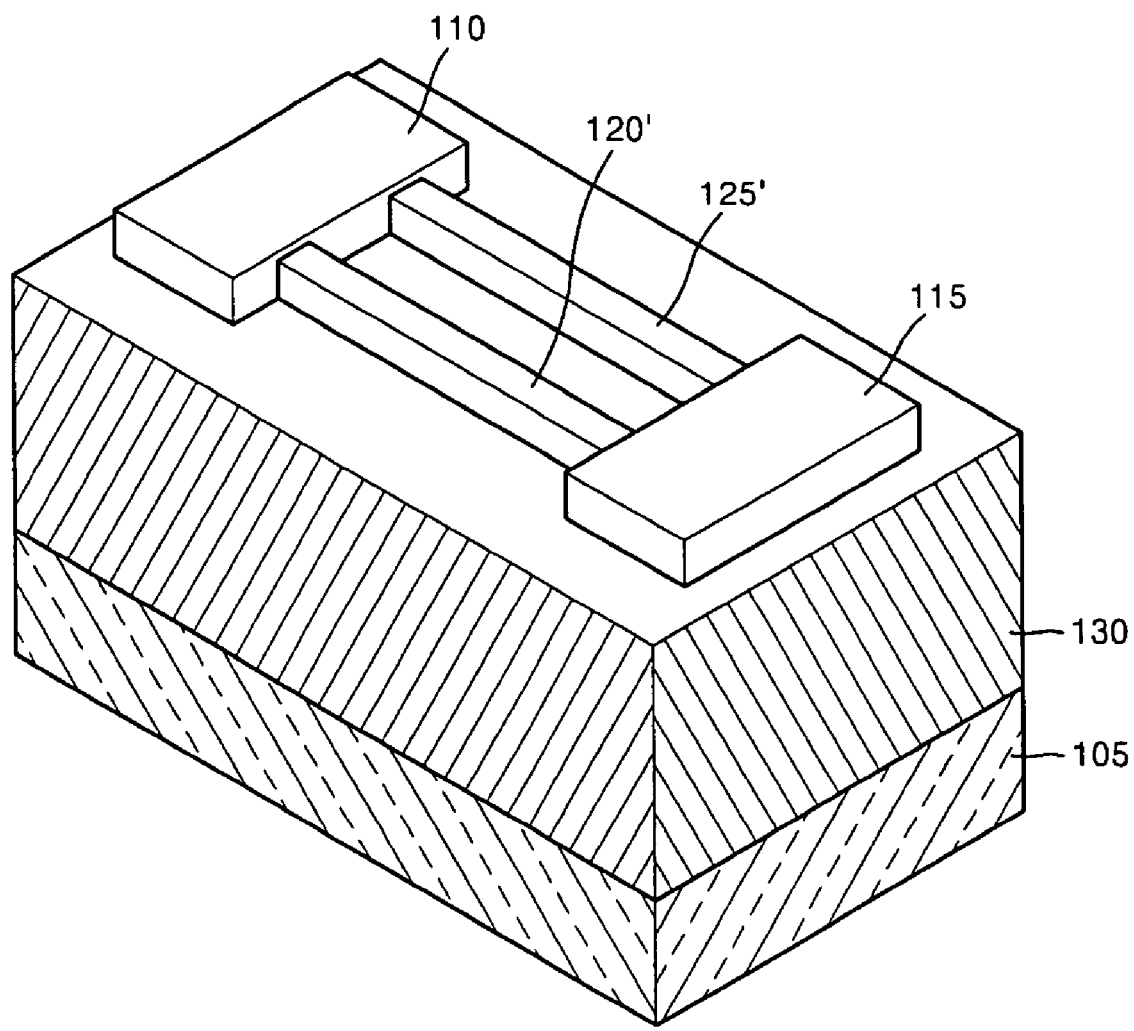
FIGS. 7 through 14 are perspective views for explaining a method of fabricating a wire-type semiconductor device, according to an example embodiment.

Referring to FIG. 7, a semiconductor substrate may be selectively etched to form a pair of support pillars 110 and 115 and fins 120' and 125', which may protrude on a body 105 of the semiconductor substrate. Both ends of the fins 120' and 125' may be supported by the support pillars 110 and 115 by being connected thereto. For example, the semiconductor substrate may be a bulk semiconductor wafer, for example, a silicon wafer, a germanium wafer, or a silicon-germanium wafer.

A mask pattern (not shown) exposing the support pillars 110 and 115 and the fins 120' and 125' may be formed on the semiconductor substrate. Next, the semiconductor substrate may be etched to a predetermined or desired depth using the mask pattern as an etch mask, thereby forming the support pillars 110 and 115 and the fins 120' and 125'. Alternatively, in order to more precisely control the widths of the fins 120' and 125', a mask pattern having a spacer shape may be used. In this example, the support pillars 110 and 115 and the fins 120' and 125' may be formed by separate processes.

A device insulating layer 130 may be formed on the body 105 so as to expose the upper surfaces of the support pillars 110 and 115 and the fins 120' and 125'. The device insulating layer 130 may cover side portions of the support pillars 110 and 115, and the fins 120' and 125'. The heights of upper portions of the fins 120' and 125', which protrude above the device insulating layer 130 may determine the sizes of the upper semiconductor wires 120*a* and 125*a* (FIG. 10), which will be formed later. For example, an insulating layer (not shown) may be formed on the body 105 using chemical vapor deposition (CVD). Next, the insulating layer is planarized and etched by a predetermined or desired thickness, thereby resulting in the device insulating layer 130. For example, the device insulating layer 130 may include an oxide layer, a nitride layer, or any suitable insulating layer.

A process of forming the upper semiconductor wires 120a and 125a will be described with reference to FIG. 8 through 10.

Figure 8:
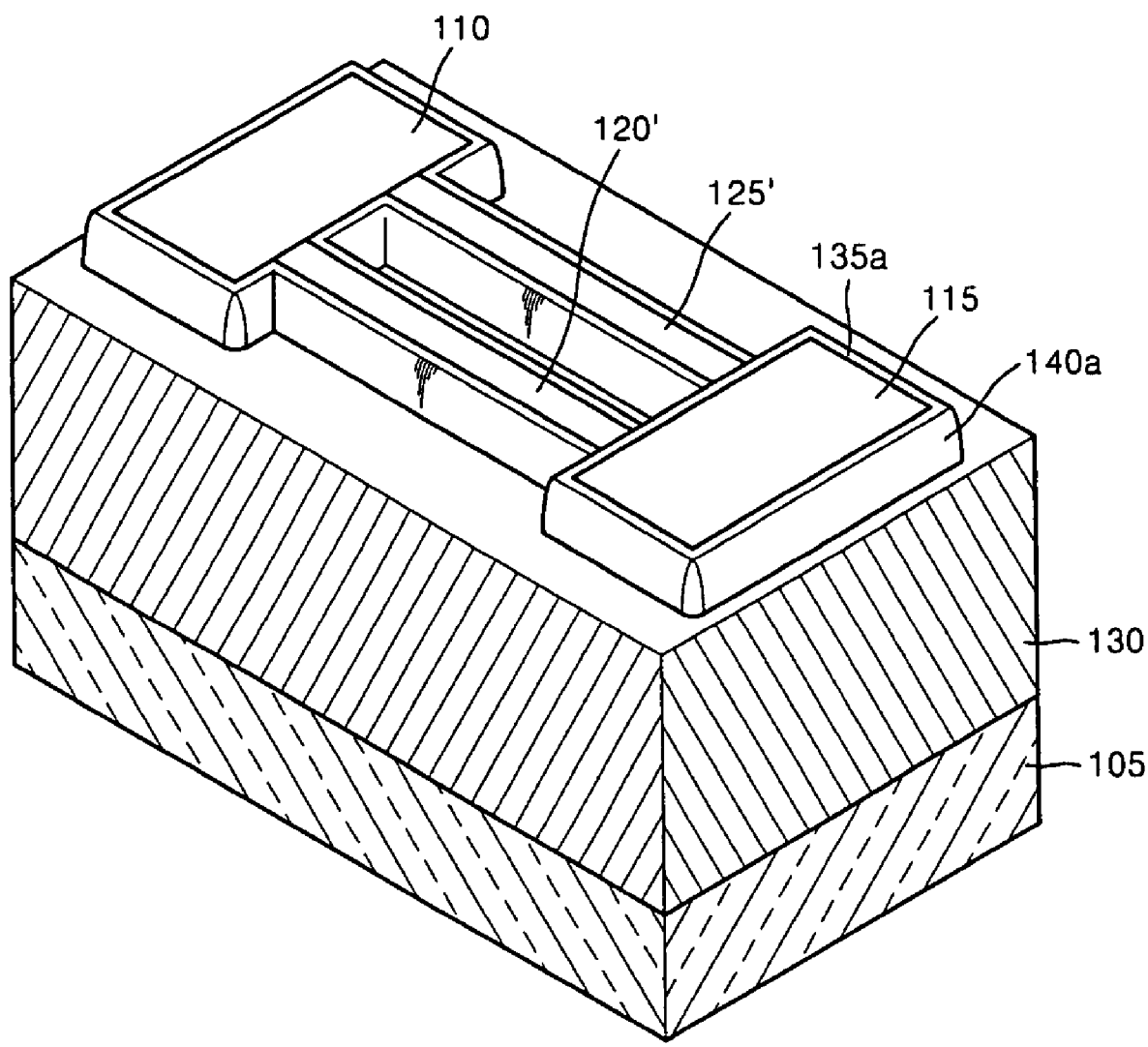

Referring to FIG. 8, a first buffer insulating layer 135a and a first spacer insulating layer 140a may be formed sequentially on sidewalls of the exposed upper portions of the support pillars 110 and 115 and the fins 120' and 125', which protrude above the device insulating layer 130. The first buffer insulating layer 135a may relieve the stress of the first spacer insulating layer 140a. According to at least one example embodiment, alternatively, the first buffer insulating layer 135a may not be formed.

For example, the first buffer insulating layer 135a may include an oxide layer, and the first spacer insulating layer 140a may include a nitride layer or an oxynitride layer, or any other suitable layer. The first spacer insulating layer 140a may be formed by forming and anisotropically etching an insulating layer (not shown). The first spacer insulating layer 140a may have an etch selectivity with respect to the device insulating layer 130.

Figure 9:
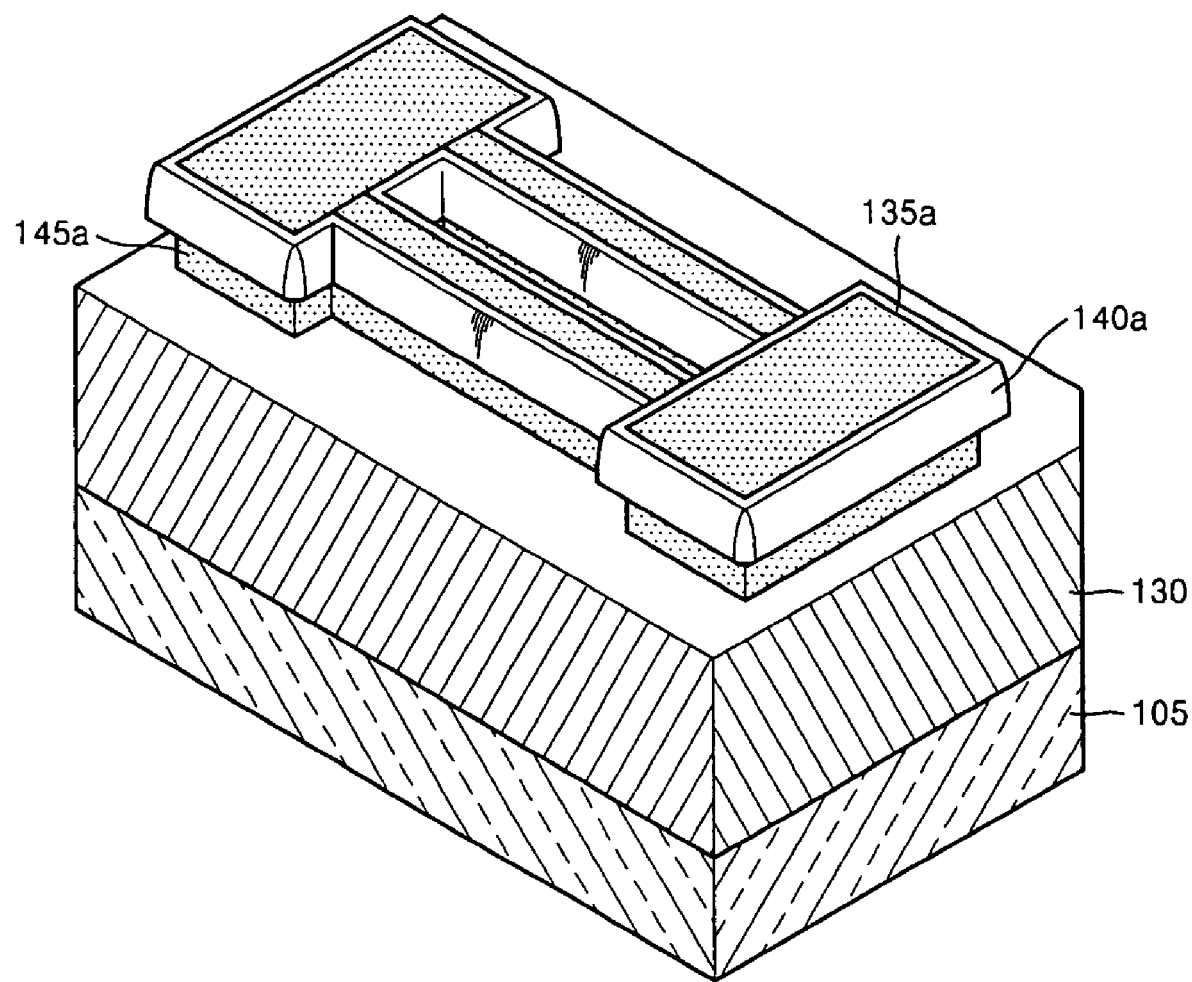

Referring to FIG. 9, the device insulating layer 130 may be etched by a predetermined or desired thickness using the first spacer insulating layer 140a as an etch mask. Therefore, portions of the support pillars 110 and 115 (FIG. 8) and the fins 120' and 125' (FIG. 8) between the first spacer insulating layer 140a and the device insulating layer 130 may be exposed. For example, the device insulating layer 130 may be etched by a predetermined or desired thickness using isotropic wet etching.

Subsequently, the exposed portions of the support pillars 110 and 115 and the fins 120' and 125' may be oxidized to form a first sacrificial oxide layer 145a. In this example, the first sacrificial oxide layer 145a may also be simultaneously formed on the top surfaces of the support pillars 110 and 115 and the fins 120' and 125'. In the oxidation process, the exposed portions of the fins 120' and 125' may be oxidized.

Because the support pillars 110 and 115 have a larger width than the fins 120' and 125', the first sacrificial oxide layer 145a may be formed on the surfaces of the support pillars 110 and 115. Thus, the oxidation time may be controlled so as to oxidize all the exposed portions of the fins 120' and 125' and surface portions of the exposed portions of the support pillars 110 and 115.

However, in another example embodiment, the sidewalls of the support pillars 110 and 115 may not be oxidized. In this example embodiment, the first sacrificial oxide layer 145a may be formed only on the fins 120' and 125'.

Figure 10:
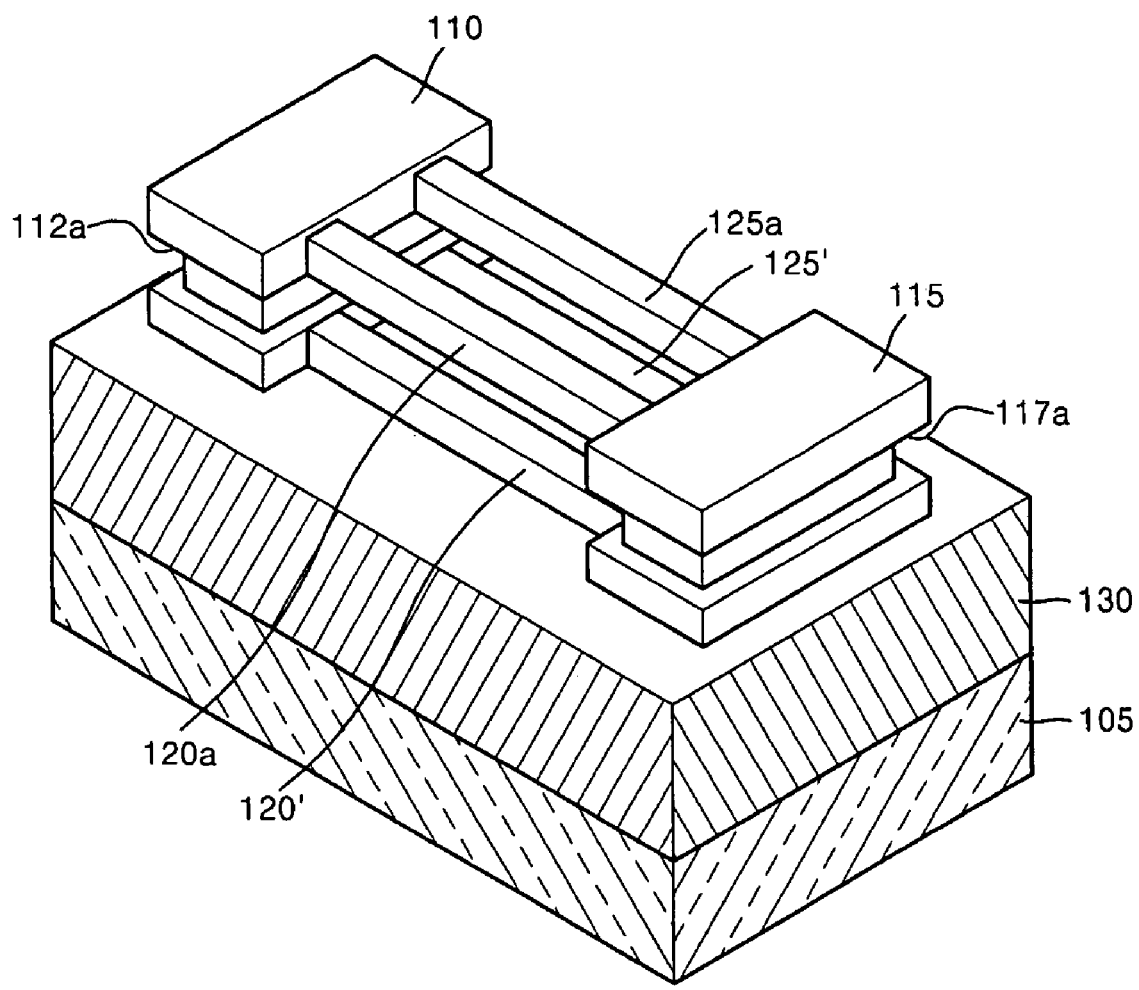

Referring to FIG. 10, the first sacrificial oxide layer 145a (FIG. 9), the first buffer insulating layer 135a (FIG. 9), and the first spacer insulating layer 140a (FIG. 9) may be removed to form an upper tunnel (not shown). As a result, the heights of the fins 120' and 125' may be reduced, and the upper semiconductor wires 120a and 125a may be formed. The upper semiconductor wires 120a and 125a may be separated from the fins 120' and 125' by the upper tunnel. Both ends of each of the upper semiconductor wires 120a and 125 are connected to the support pillars 110 and 115. In other words, the upper semiconductor wires 120a and 125a may be edge portions of the fins 120' and 125' (FIG. 9) separated there-from by the upper tunnel. When the upper tunnel is formed, the remaining upper portions of the fins 120' and 125' may be exposed by partial removal of the device insulating layer 130.

Upper recess, portions 112a and 117a may be formed on the sidewalls of the support pillars 110 and 115 simultaneously with the formation of the semiconductor wires 120a and 125a. However, in at least one example embodiment, the first sacrificial oxide layer 145a (FIG. 9) is not formed on the support pillars 110 and 115, thus the upper recess portions 112a and 117a may not be formed.

For example, the first sacrificial oxide layer 145a, the first buffer insulating layer 135a, and the first spacer insulating layer 140a may be removed using wet etching. The first sacrificial oxide layer 145a and the first buffer insulating layer 135a may be removed using a wet etching solution containing fluoric acid. The first spacer insulating layer 140a may be removed using a wet etching solution containing phosphoric acid.

In another example embodiment, the upper tunnel may be formed using etching without performing the oxidation process described with reference to FIG. 9.

A process of forming the lower semiconductor wires 120b and 125b will be described with reference to FIG. 11 through 13. For example, FIG. 11 through 13 may illustrate a process of repeatedly performing the processes of FIG. 8 through 10 on the fins 120' and 125'. Accordingly, the descriptions with reference to FIG. 8 through 10 may be referred to here.

Figure 11:
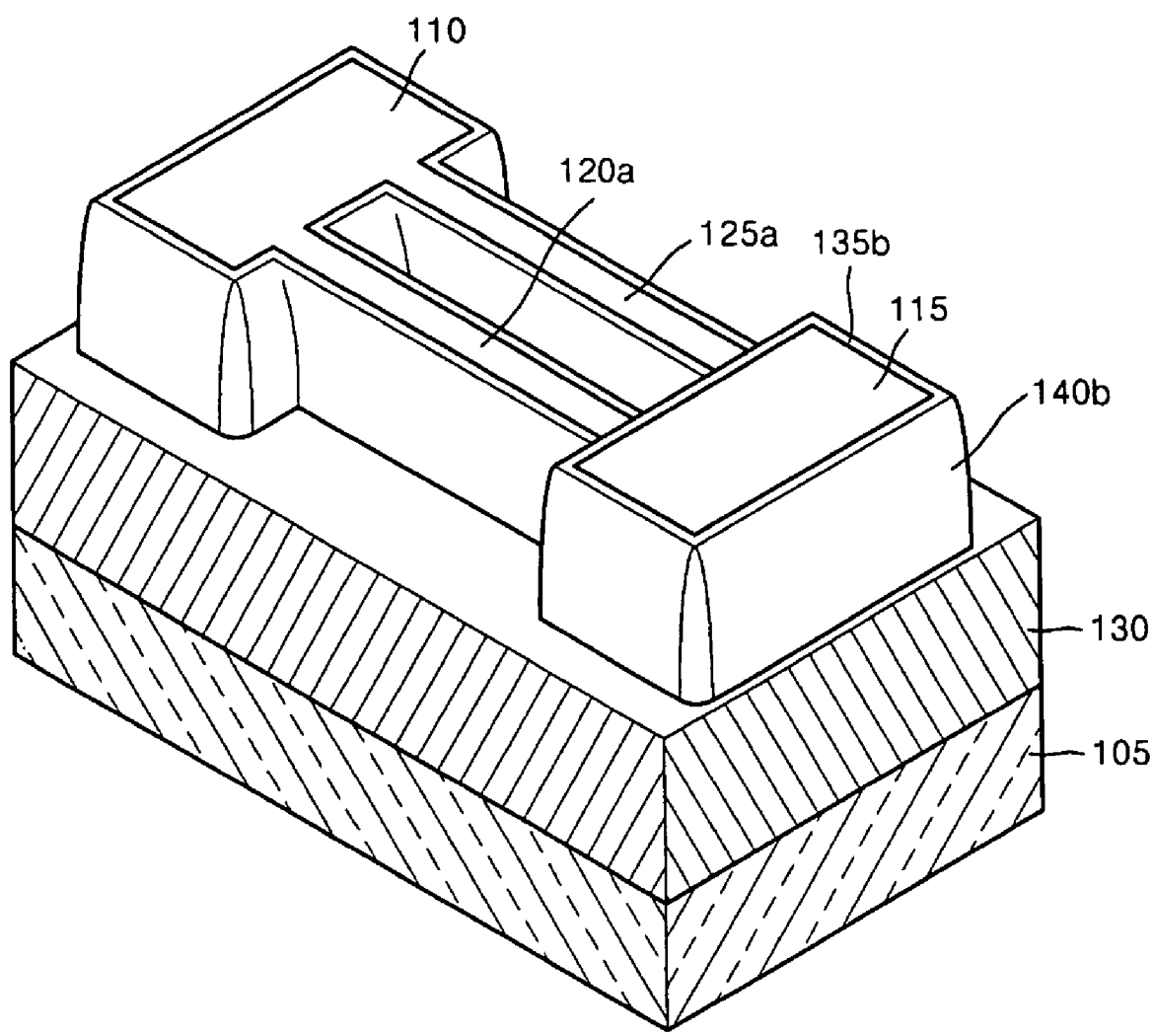

Referring to FIG. 11, a second buffer insulating layer 135b and a second spacer insulating layer 140b may be formed sequentially so as to cover the sidewalls of the exposed portions of the support pillars 110 and 115 and the fins 120' and 125', which protrude above the device insulating layer 130. Accordingly, the first buffer insulating layer 135b and the second spacer insulating layer 140b are formed to be relatively higher than the first buffer insulating layer 135a and the first spacer insulating layer 140a in FIG. 8.

Figure 12:
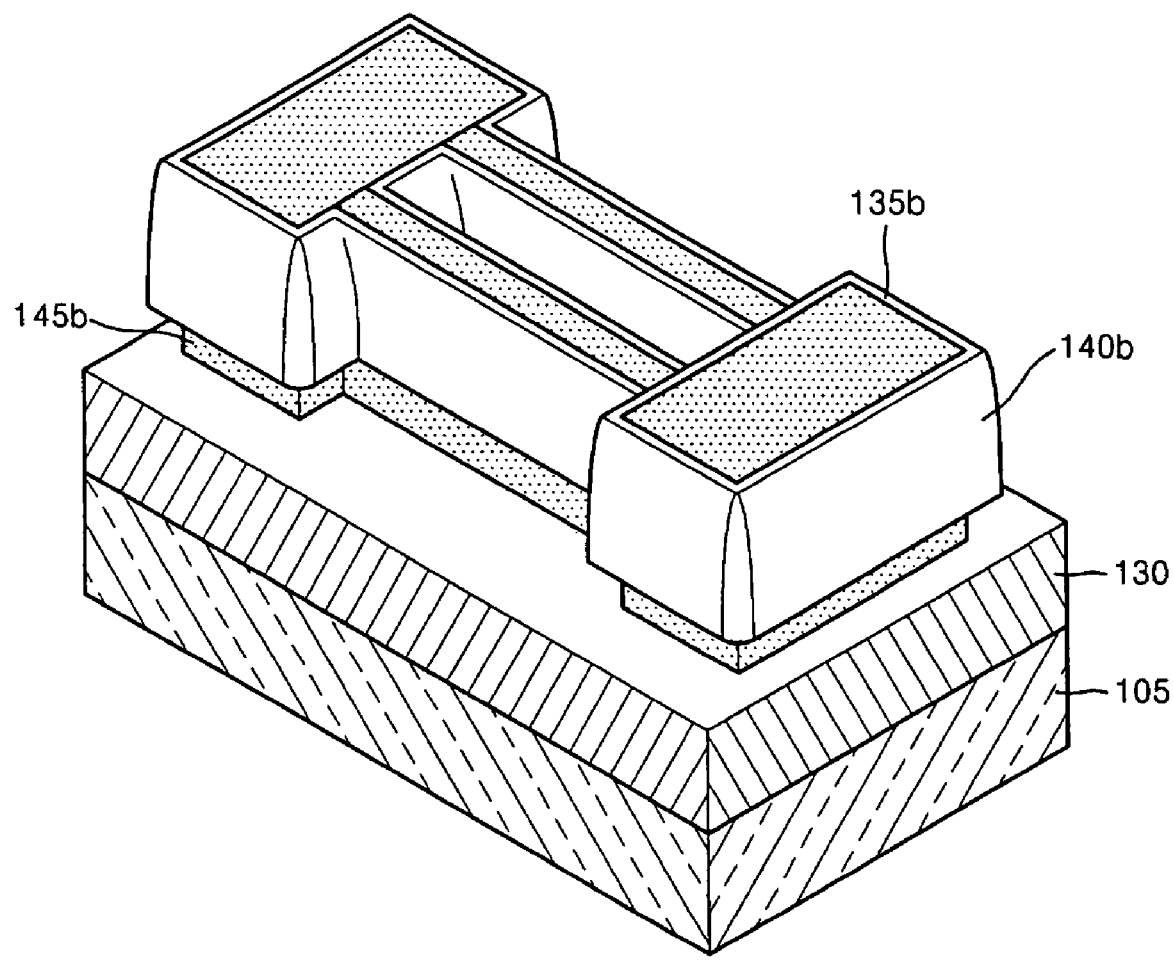

Referring to FIG. 12, the device insulating layer 130 may be etched by a predetermined or desired thickness using the second spacer insulating layer 140b as an etch mask. As a result, portions of the support pillars 110 and 115 and the fins 120' and 125' between the second spacer insulating layer 140b and the device insulating layer 130 may be exposed.

Subsequently, the exposed portions of the support pillars 110 and 115 and the fins 120' and 125' may be oxidized so as to form a second sacrificial oxide layer 145b. In at least one example embodiment, the second sacrificial oxide layer 145b may be formed simultaneously on the top surfaces of the support pillars 110 and 115 and the fins 120' and 125'.

Figure 13:
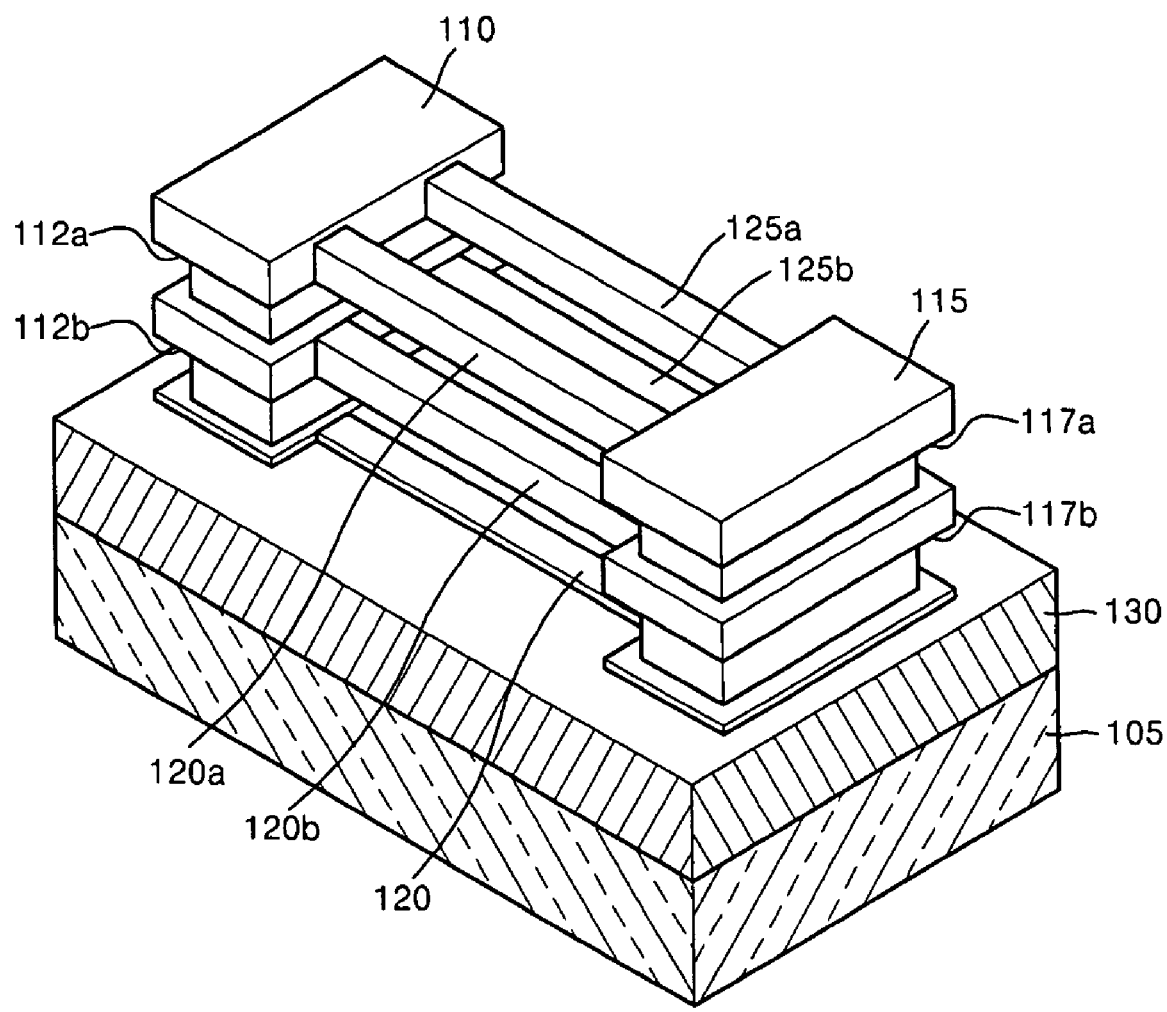

Referring to FIG. 13, the second sacrificial oxide layer 145b (FIG. 12), the second buffer insulating layer 135b, and the second spacer insulating layer 140b are removed so as to form a lower tunnel (not shown). As a result, lower semiconductor wires 120b and 125b separated from the fins 120 and 125 by the lower tunnel are formed. Both ends of each of the lower semiconductor wires 120b and 125b are connected to the support pillars 110 and 115. In other words, the lower semiconductor wires 120b and 125b may be edge portions of the fins 120' and 125' (FIG. 12) separated there-from by the lower tunnel. When the lower tunnel is formed, the remaining upper portions of the fins 120 and 125 may exposed by partial removal of the device insulating layer 130.

Lower recess portions 112b and 117b may be formed on the sidewalls of the support pillars 110 and 115 simultaneously with the formation of the lower semiconductor wires 120b and 125b. However, as described above, the lower recess portions 112b and 117b may not be formed on the support pillars 110 and 115.

In another example embodiment, without the process described with reference to FIG. 10, the upper tunnel and the lower tunnel may be simultaneously or sequentially formed by simultaneously or sequentially removing the first sacrificial oxide layer 145a (FIG. 9) and the second sacrificial oxide layer 145b (FIG. 12) in the process of FIG. 13.

Figure 14:
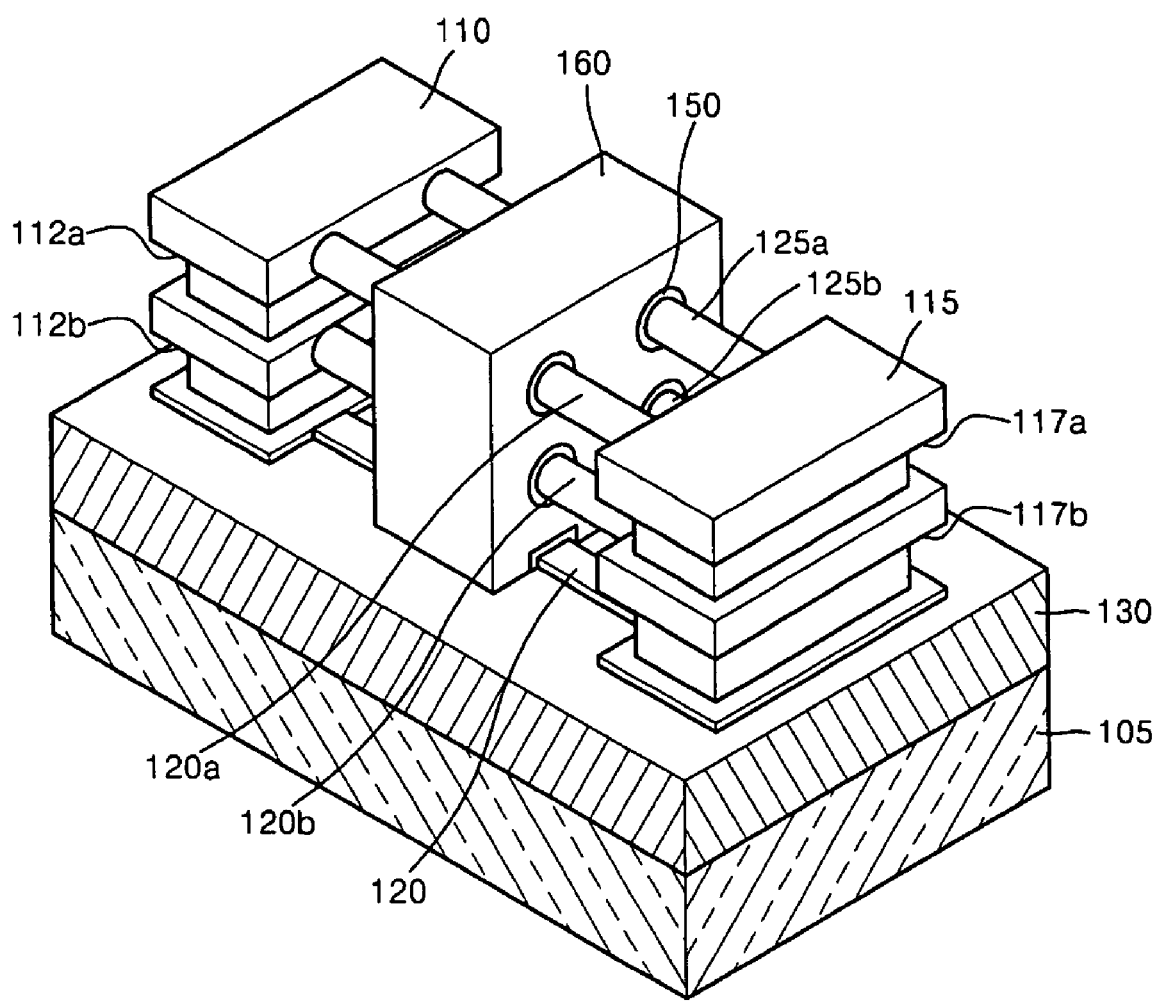

Referring to FIG. 14, gate insulating layers 150 and a common gate electrode 160 are formed. For example, the gate insulating layers 150 may be formed by thermally oxidizing the surfaces of the upper and lower semiconductor wires 120a, 125a, 120b, and 125b. Gate insulating layers 150 may also be formed on the top surfaces of the fins 120 and 125.

The common gate electrode 160 may be formed on the gate insulating layers 150 so as to surround the upper and lower semiconductor wires 120a, 125a, 120b, and 125b. In addition, the common gate electrode 160 may further cover the top surfaces of the fins 120 and 125. The common gate electrode 160 may be insulated from the body 105 by the device insulating layer 130. For example, the common gate electrode 160 may be formed using a photolithography patterning method or a damascene method.

For example, the surfaces of the upper and lower semiconductor wires 120a, 125a, 120b, and 125b may be further spherecalized prior to formation of the gate insulating layer 150. The spherecalizing process may be performed by thermally oxidizing the surfaces of the upper and lower semiconductor wires 120a, 125a, 120b, and 125b. Optionally, the thermal oxide layers may be removed before the gate insulating layer 150 is formed.

In addition, source and drain regions (not shown) may be formed by doping portions of the upper and lower semiconductor wires 120a, 125a, 120b, and 125b and the support pillars 110 and 115 on both sides of the common gate electrode 160 with impurities. Subsequently, a metal interconnection may be formed using a common method which is widely known to one of ordinary skill in the art. Therefore, detailed description of metal interconnection will be omitted herein for the sake of brevity.

In the method of fabricating a wire-type semiconductor device according to example embodiments, a bulk semiconductor substrate may be used such that the manufacturing cost may be lower compared to using a conventional SOI substrate.

In the method of fabricating a wire-type semiconductor device according to example embodiments, the number of fins 120 and 125, and the number of semiconductor wires 120a, 125a, 120b, and 125b are given for illustrative purposes only, and thus can be varied. For example, the lower semiconductor wires 120b and 125b may not be formed by omitting the processes described with reference to FIG. 10 through 13. Alternatively, additional semiconductor wires (not shown) may be formed by repeating the processes described with reference to FIG. 10 through 13. In addition, the support pillars 110 and 115 may be formed as an array on the semiconductor substrate.

While example embodiments have been particularly shown and described with reference to the attached drawings, it will be understood by those of ordinary skill in the art that various changes in form and details may be made therein without departing from the spirit and scope of the present invention as defined by the following claims.

What is claimed is:

1. A wire-type semiconductor device comprising:
   at least one pair of support pillars protruding above a semiconductor substrate;
   at least one fin protruding above the semiconductor substrate and having ends connected to the at least one pair of support pillars;
   at least one semiconductor wire having ends connected to the at least one pair of support pillars and being separated from the at least one fin;
   a common gate electrode surrounding the surface of the at least one semiconductor wire and covering an upper portion of the fin on the semiconductor substrate;
   a first gate insulating layer between the at least one semiconductor wire and the common gate electrode; and
   a second gate insulating layer between the at least one fin and the common gate electrode,
   wherein the at least one semiconductor wire is formed above the at least one fin, and
   end portions of the at least one semiconductor wire are exposed by the common gate electrode and are doped with first conductive type impurities.

2. The wire-type semiconductor device of claim 1, wherein the at least one semiconductor wire is formed by etching the semiconductor substrate.

3. The wire-type semiconductor device of claim 1, wherein the semiconductor substrate includes one of a bulk silicon wafer, a bulk germanium wafer, and a bulk silicon-germanium wafer.

4. The wire-type semiconductor device of claim 1, wherein:
   a plurality of fins are formed on the semiconductor substrate; and
   the at least one semiconductor wire is formed above the plurality of fins.

5. The wire-type semiconductor device of claim 1, wherein each of the support pillars includes a recess portion.

6. The wire-type semiconductor device of claim 1, wherein:
   the pair of support pillars is doped with the first conductive type impurities;
   a portion of the at least one semiconductor wire surrounded by the common gate electrode is doped with second conductive type impurities; and
   the second conductive type impurities have a conductivity opposite to the conductivity of the first conductive type impurities.

7. The wire-type semiconductor device of claim 1, further comprising:
   a device insulating layer on the substrate, the device insulating layer exposing the upper portion of the at least one fin on the semiconductor substrate.

* * * * *